US009865749B1

(12) United States Patent
Chiola et al.

(10) Patent No.: US 9,865,749 B1
(45) Date of Patent: Jan. 9, 2018

(54) MERGED P-I-N SCHOTTKY STRUCTURE

(75) Inventors: Davide Chiola, Marina del Rey, CA (US); Kohji Andoh, El Segundo, CA (US); Silvestro Fimiani, Turin (IT)

(73) Assignee: Siliconix Technology C. V., Singapore (SG)

( * ) Notice: Subject to any disclaimer, the term of this patent is extended or adjusted under 35 U.S.C. 154(b) by 1006 days.

(21) Appl. No.: 12/962,563

(22) Filed: Dec. 7, 2010

Related U.S. Application Data

(60) Continuation of application No. 11/402,039, filed on Apr. 11, 2006, now Pat. No. 7,858,456, which is a division of application No. 10/766,466, filed on Jan. 27, 2004, now Pat. No. 7,071,525.

(51) Int. Cl.
- *H01L 21/28* (2006.01)
- *H01L 29/872* (2006.01)
- *H01L 29/868* (2006.01)
- *H01L 29/06* (2006.01)

(52) U.S. Cl.
CPC ........ *H01L 29/872* (2013.01); *H01L 29/0684* (2013.01); *H01L 29/868* (2013.01)

(58) Field of Classification Search
None
See application file for complete search history.

(56) References Cited

U.S. PATENT DOCUMENTS

| 6,294,445 | B1 * | 9/2001 | Bol et al. | 438/534 |
|---|---|---|---|---|
| 6,524,900 | B2 * | 2/2003 | Dahlqvist et al. | 438/167 |
| 6,861,723 | B2 * | 3/2005 | Willmeroth | 257/471 |
| 7,071,525 | B2 | 7/2006 | Chiola et al. | |
| 7,858,456 | B2 | 12/2010 | Chiola et al. | |
| 2002/0125541 | A1 * | 9/2002 | Korec et al. | 257/471 |
| 2003/0020133 | A1 * | 1/2003 | Dahlqvist et al. | 257/471 |
| 2003/0057482 | A1 * | 3/2003 | Harada | 257/329 |
| 2004/0061195 | A1 * | 4/2004 | Okada et al. | 257/477 |
| 2004/0212011 | A1 * | 10/2004 | Ryu | 257/335 |
| 2006/0255423 | A1 * | 11/2006 | Ryu et al. | 257/485 |

FOREIGN PATENT DOCUMENTS

| JP | 03-024767 | 2/1991 |
|---|---|---|
| JP | 10-117003 | 5/1998 |

\* cited by examiner

*Primary Examiner* — Abul Kalam

(57) ABSTRACT

A Merged P-i-N Schottky device in which the oppositely doped diffusions extend to a depth and have been spaced apart such that the device is capable of absorbing a reverse avalanche energy comparable to a Fast Recovery Epitaxial Diode having a comparatively deeper oppositely doped diffusion region.

20 Claims, 5 Drawing Sheets

MERGED P-I-N SCHOTTKY STRUCTURE

CROSS-REFERENCE TO RELATED APPLICATIONS

This application is a continuation of and claims the benefit of the co-pending, commonly-owned U.S. patent application Ser. No. 11/402,039, filed on Apr. 11, 2006, by Chiola et al., and titled "MERGED P-i-N SCHOTTKY STRUCTURE," which is a divisional of U.S. patent application Ser. No. 10/766,466, filed on Jan. 27, 2004, by Chiola et al., and titled "MERGED P-i-N SCHOTTKY STRUCTURE," the entire contents of which are incorporated herein by reference.

FIELD OF THE INVENTION

This invention is related to semiconductor devices and more particularly to a Merged P-i-N Schottky (MPS) diode.

BACKGROUND OF THE INVENTION

FIG. 1A shows the cross-section of a Fast Recovery Epitaxial Diode (FRED) 10 according to the prior art. FRED 10 comprises a lightly-doped N silicon epitaxial layer 12 which is formed on a highly doped N+ silicon substrate 14. A p+ doped diffusion well 16 is formed on a portion of the upper region of epitaxial layer 12. FRED 10 includes first major electrode 18 that is in surface-to-surface contact with diffusion well 16 and silicon dioxide layer 20 which surrounds and is partially in contact with the outer periphery of diffusion well 16. FRED 10 also includes second major electrode 22 which is disposed on a surface of silicon substrate 14 opposing first major electrode 18 of FRED 10.

Diffusion well 16 of FRED 10 is relatively shallow and may range between 3 μm to 6 μm for 200-600 volt devices. It has been found that 3 μm-6 μm deep diffusion well 16 provides a good tradeoff between performance and manufacturing complexity. However, devices having shallow diffusion wells do not have the capability to absorb reverse avalanche energy well.

The difference between the bulk breakdown voltage (BV), which represents the ideal breakdown voltage for a planar junction, and the actual BV for a FRED has been used to isolate the reason for the inability of FRED 10 to satisfactorily absorb reverse avalanche energy.

Referring, for example, to Table 1, FRED 10 which has a 6 μm deep diffusion well 16 can have an actual device BV that may be between 36-70 volts lower than bulk BV. It should be noted that although the thickness of the epitaxial layer 12 contributes to the difference between the bulk BV and the actual device By, the peak electric field is found near the corners of diffusion well 16 at breakdown due to the crowding of the electric field lines. It is believed that these localized regions of high electric field, which are near the small-radius curvature of diffusion well 16, generate "hot spots" that lead to avalanche failure.

TABLE I

| Standard Epi Profile | | | | | |
|---|---|---|---|---|---|
| Epi thick [μm] | Epi res. (Ohm-cm) | Junction Depth (Xj) | Device BV[V] | One-d BV ("bulk" BV) [V] | Delta BV [V] |
| 30 | 12 | 6 | 344 | 383 | 39 |
| 34 | 12 | 6 | 356 | 426 | 70 |
| 30 | 14 | 6 | 350 | 386 | 36 |
| 34 | 14 | 6 | 377 | 442 | 65 |

It has also been found that FRED 10 having a linearly graded or double-profiled epitaxial layer 12 still has a device BV that is lower than an ideal bulk BV.

Referring to Table 2, for example, FRED 10 having a linearly graded epitaxial layer 12, and a 6 μm diffusion well 16 exhibits an actual device BV that is between 25-32V lower than the ideal bulk By. Epitaxial layer 12 of FRED 10 of Table 2 has a linearly graded tail (Epi 2) with a concentration of dopants that is varied during the epitaxial growth and is kept constant during the final growth of the second layer (Epi I). FIG. 1B shows a linearly graded epitaxial layer 12 graphically.

TABLE 2

| Graded Profile | | | | | | | |
|---|---|---|---|---|---|---|---|
| Epi 1 thick [μm] | Epi 1 Res (Ohm-cm) | Epi 2 Thick [μm] | Epi 2 Res (Ohm-cm) | Xj (μm) | Device BV [V] | One-d BV ("bulk" BV) [V] | Delta BV [V] |
| 15 | 20 | 15 | 20-1 | 6 | 300 | 325 | 25 |
| 15 | 20 | 15 | 20-4 | 6 | 352 | 384 | 32 |
| 15 | 20 | 15 | 20-6 | 6 | 365 | 392 | 27 |

Referring to Table 3, as yet another example, FRED 10 having a double-profiled epitaxial layer 12, and a 6 μm diffusion well 16 can have an actual device BV which is 27-28 volts less than the ideal bulk By. Epitaxial layer 12 of FRED 10 of Table 3 has a first layer (Epi 2) of constant concentration and a second layer (Epi 1) of constant concentration. FIG. 1C shows a double-profiled epitaxial layer graphically.

TABLE 3

| Double Profile | | | | | | | |
|---|---|---|---|---|---|---|---|
| Epi 1 thick [μm] | Epi 1 Res (Ohm-cm) | Epi 2 Thick [μm] | Epi 2 Res (Ohm-cm) | Xj (μm) | Device BV [V] | One-d BV ("bulk" BV) [V] | Delta BV [V] |
| 15 | 20 | 15 | 3.5 | 6 | 315 | 343 | 28 |
| 15 | 20 | 15 | 8 | 6 | 354 | 381 | 27 |

Comparison of the data in Table 1, Table 2 and Table 3 indicates that by grading the profile of epitaxial layer 12, the difference between actual device BV and the ideal bulk BV can be reduced. However, the difference between the actual and the ideal breakdown voltages remains high for FRED 10 having a shallow 6 μm diffusion well. Moreover, the crowding of the electric field lines near the corners of diffusion well 16 is still observed in FRED 10 of Table 2 and Table 3. Thus, profile grading does not appear to strengthen the ability of FRED 10 to absorb the reverse avalanche energy.

Referring now to Table 4, diffusion well 16 of FRED 10 of Table 2 having a linearly graded profile was extended from 6 μm to 10 μm. In order to achieve a total bulk thickness of 30 μm, the Epi layer was thickened by 4 μm. As shown in Table 4, the increase in the depth of diffusion well 16 by 4 μm reduced the difference between the actual device BV and the ideal bulk BV.

TABLE 4

| | | | Graded Profile | | | | |
|---|---|---|---|---|---|---|---|
| Epi 1 thick [μm] | Epi 1 Res (Ohm-cm) | Epi 2 Thick [μm] | Epi 2 Res (Ohm-cm) | Xj (μm) | Device BV [V] | One-d BV ("bulk" BV) [V] | Delta BV [V] |
| 19 | 20 | 15 | 20-1 | 10 | 365 | 398 | 32 |
| 19 | 20 | 15 | 20-4 | 10 | 321 | 340 | 19 |
| 19 | 20 | 15 | 20-6 | 10 | 265 | 277 | 12 |

Further increases in the depth of diffusion well 16 from 15 μm to 20 μm in the epitaxial layer 12 of the device of Table 4 showed further reduction in the difference between actual device BV and ideal bulk BV. While this reduction between actual and ideal breakdown voltages is partly due to the thinning of the bulk thickness caused by the deepening of diffusion well 16, the deepening of diffusion well 16 has a substantial reducing effect on the difference between the actual and the ideal breakdown voltages. This reduction is believed to be due to the relaxation of the electric field lines as the radius of curvature near the corners of diffusion well 16 is increased, as well as, the spreading of the field lines toward the main portion of the PN junction (the junction between the diffusion well 16 and epitaxial layer 12), which helps to distribute the reverse avalanche energy over a wider area.

FIG. 2 shows FRED 24 having a 20 μm deep diffusion well 16 and a graded epitaxial layer 12 of very low doping level (approximately $1 \times 10^4$ cm$^3$). FRED 24 has an actual device BV which is only about 2.9 volts less than the ideal Bulk BV at 25° C. and about only 8.3 volts at 125° C. for 100 μA. Depending on the doping of epitaxial layer 12, FRED 10 (FIG. 1A) can have an avalanche voltage that changes by 25-40 volts when the temperature of the PN junction is raised from 25° C. to 125° C. It should be noted that corners of diffusion well 16 of FRED 24 are flatter and thus have a larger radius, which, it is believed, contribute to the capability of FRED 24 to absorb the reverse avalanche energy and increase the actual device BV of FRED 24.

To obtain a deep diffusion well 16, such as the one shown in FIG. 2, diffusion of dopants must be conducted at relatively high temperatures which may be in the order of 1250° C. or higher, and typically for a long drive-in time. In contrast, shallower diffusion well 16, such as the one shown by FIG. 1A may be obtained at considerably lower temperatures, which maybe in the order of about 1100° C., and for a shorter drive-in time. Given that many fabrication laboratories do not have the capability for deep diffusion at high temperatures, it is desirable to have an alternative device, which does not require a high temperature diffusion step, that is capable of absorbing the reverse avalanche energy of a FRED having a deep diffusion well 16, such as FRED 24 of FIG. 2.

SUMMARY OF THE INVENTION

A semiconductor device according to the present invention is an MPS capable of absorbing the reverse avalanche energy absorbed by a FRED 24 (e.g. FIG. 2) having a deep diffusion well 16.

MPS devices are known. U.S. Pat. No. 4,862,229 shows an MPS type device in which oppositely doped diffusions are integrated with a Schottky structure. The conventional thinking in the design of prior art MPS devices is to space the diffusions as close as possible so that under the reverse bias condition the depletion layers around the diffusions link up quickly to improve the breakdown voltage of the device. It has been found, however, that contrary to conventional thinking, in an MPS having shallow diffusion stripes, spacing the diffusions wider apart improves the absorption of reverse avalanche energy and thus improves the ability of the device to withstand breakdown under reverse bias conditions. Specifically, it has been found that by appropriate adjustment of the distance between the diffusion stripes in an MPS, shallower diffusions can be used to achieve the same ability to withstand breakdown as a prior art device with a deeper diffusion well. Thus, with lower temperature processing (and thus lower cost) a device can be obtained that exhibits the same or comparable characteristics as a device manufactured by a higher temperature process (and thus higher cost).

An MPS according to the present invention include an array of P+ diffusion stripes each spaced from at least one other adjacently disposed stripe. According to the present invention, the distance between each stripe has been set so that the capability of the MPS device to withstand breakdown under reverse bias condition is adapted to be close to that of a FRED with a deeper diffusion well.

The stripes in an MPS according to the present invention may be diffused to a depth of about 5 μm at a relatively low temperature of about 1100° C., and spaced apart up to 19 μm above which the practical advantages of spacing the stripes farther from each other are diminished or lost.

Other features and advantages of the present invention will become apparent from the following description of the invention which refers to the accompanying drawings.

DETAILED DESCRIPTION OF THE INVENTION

Figure 3:
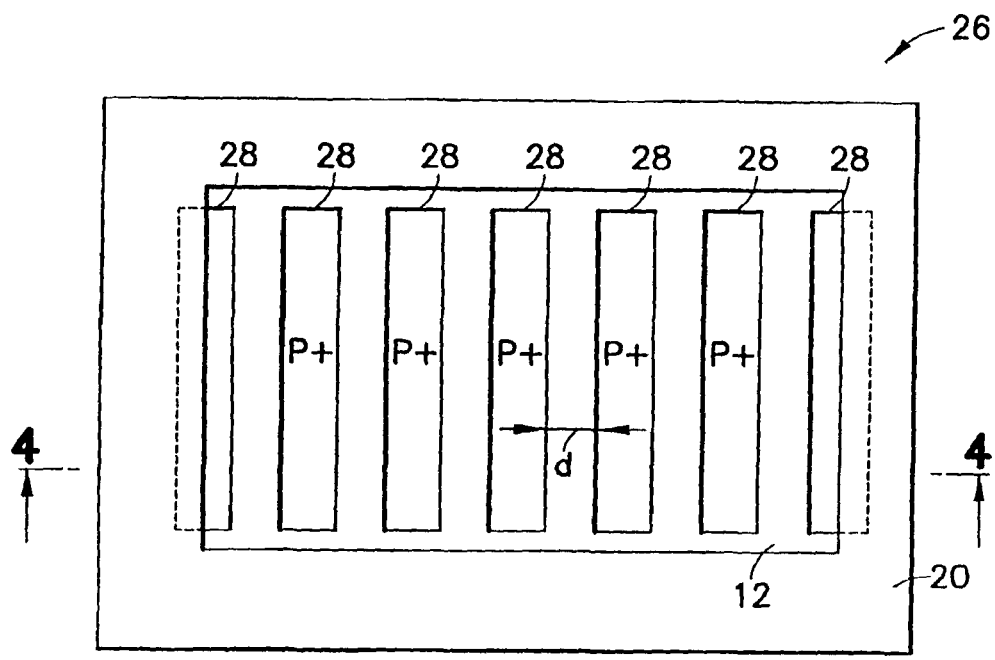
FIG. 3 is a top view of an MPS according to the present invention with the top contact removed from the view for better illustration.
Figure 4:
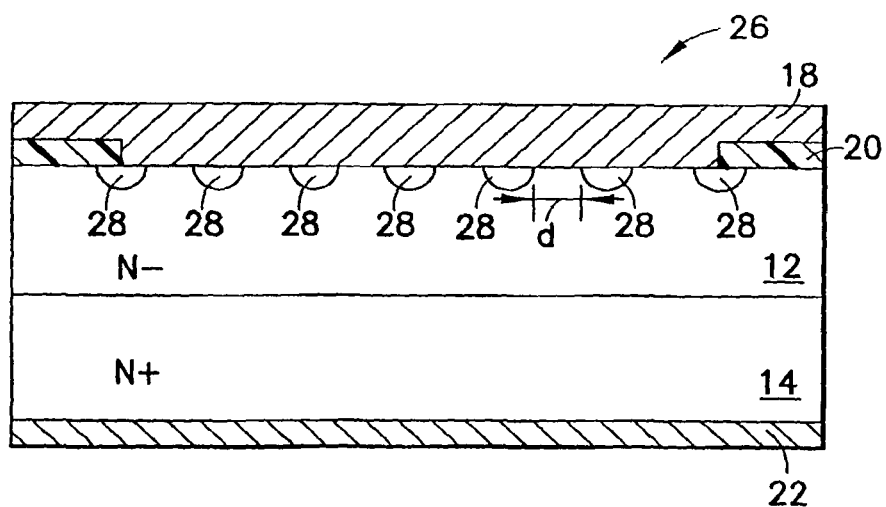
FIG. 4 is a cross-sectional view of FIG. 3 along line 4-4 viewed in the direction of the arrows.

Referring to FIGS. 3 and 4, where like numerals indicate like features, MIPS 26 according to a preferred embodiment of the present invention includes a plurality of P+ doped diffusion stripes 28 formed in N– doped silicon substrate 14. Diffusion stripes 28 are spaced from one another by a distance "d" which may be increased to increase the ability of MPS 26 to absorb the reverse avalanche energy, and may be only 5 μm deep. First major electrode 18 forms a Schottky contact with epitaxial layer 12 that is exposed between stripes 28, thereby forming an MIPS structure.

Figure 5:
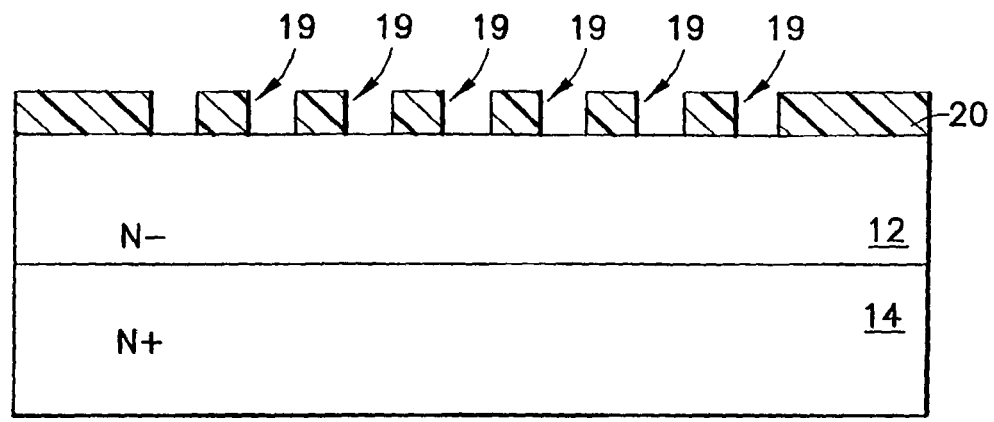
FIGS. 5 and 6 illustrate processing steps for manufacturing an MPS according to the present invention.
Figure 6:
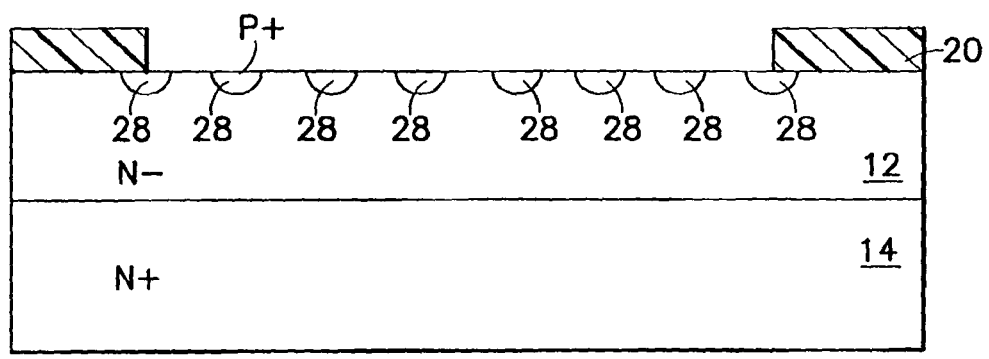

Referring now to FIGS. 5-6, MPS 26 (FIG. 4) may be manufactured by first epitaxially growing an N− doped silicon layer 12 over an N+ doped silicon substrate 14. Next, oxide layer 20 is either grown or deposited on N− doped epitaxial layer 12. Multiple windows 19 are then opened in oxide layer 20 in a photolithographic step, and P+ doped diffusion stripes 28 are formed in the top surface of N doped epitaxial layer 12 by implanting dopants through windows 19. Next, the oxide over P+ doped diffusions 28 is removed.

Subsequently, first major electrode 18 is deposited over the opening in oxide layer 20 to make contact with diffusion stripes 28, epitaxial layer 12 in the spaces between diffusion stripes 28 and at least portions of silicon dioxide layer 20. Second major electrode 22 is also deposited on silicon substrate 14 opposite to first major electrode 18 to obtain MIPS 26 as shown in FIG. 4.

According to an aspect of the present invention, diffusion stripes 28 may be formed at a relatively low temperature of about 1100° C. for a short time of about 6 hours, to a relatively shallow depth of about 5 μm, and spaced by a distance "d". The distance "d" between diffusion stripes 28 may be increased as desired to improve the ability of the device to absorb the reverse avalanche energy in MPS 26.

In the preferred embodiment, edges of the opening in oxide layer 20 may lie over the outermost stripes 28.

Also, the thickness and the doping concentration of epitaxial layer 12, as well as, the distance between diffusion stripes 28 may be varied to obtain various embodiments of MPS 26 according to the present invention.

MIPS 26, according to the first embodiment, includes diffusion stripes 28 spaced 8 μm apart, the second embodiment includes diffusion stripes 28 spaced 12 μm apart and the third embodiment includes diffusion stripes 28 that are spaced 18 μm apart. Each embodiment may have an epitaxial layer 12 which is 30 μm thick and is doped to have a resistivity of about 12 ohms/cm or an epitaxial layer 12 which is 30 μm thick and is doped to have a resistivity of about 11 ohms/cm.

Figure 1A:
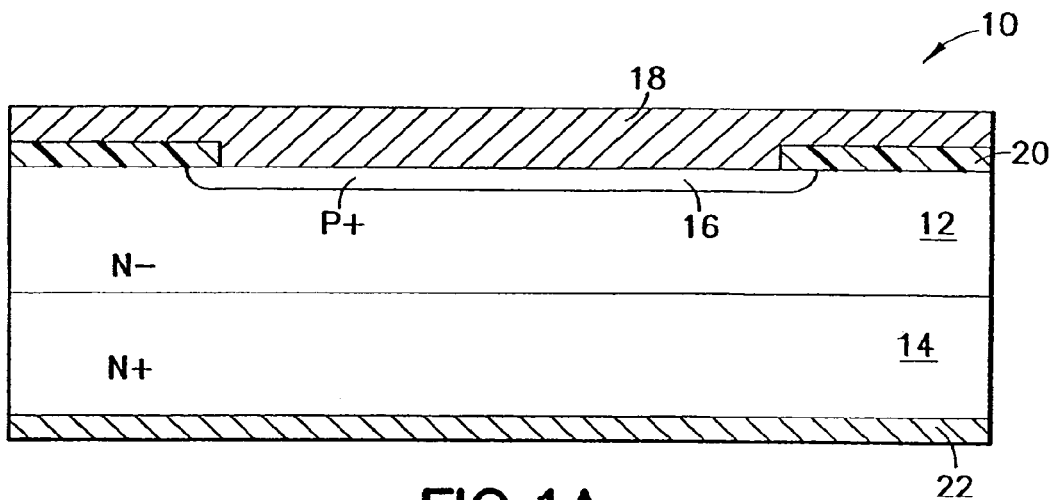
FIG. 1A is a cross-sectional view of the active region of a prior art FRED.
Figure 2:
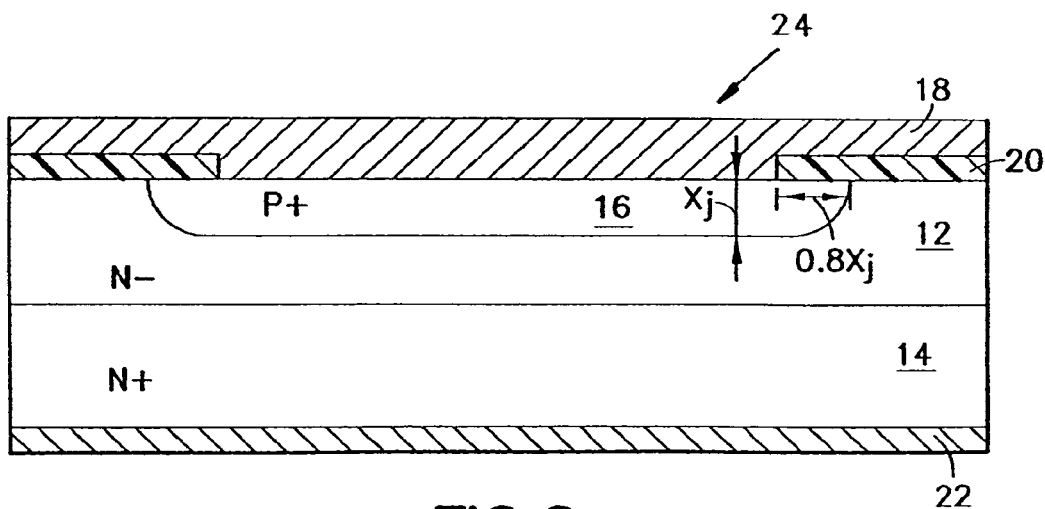
FIG. 2 is a cross-sectional view of the active region of another prior art FRED.
Figure 1B:
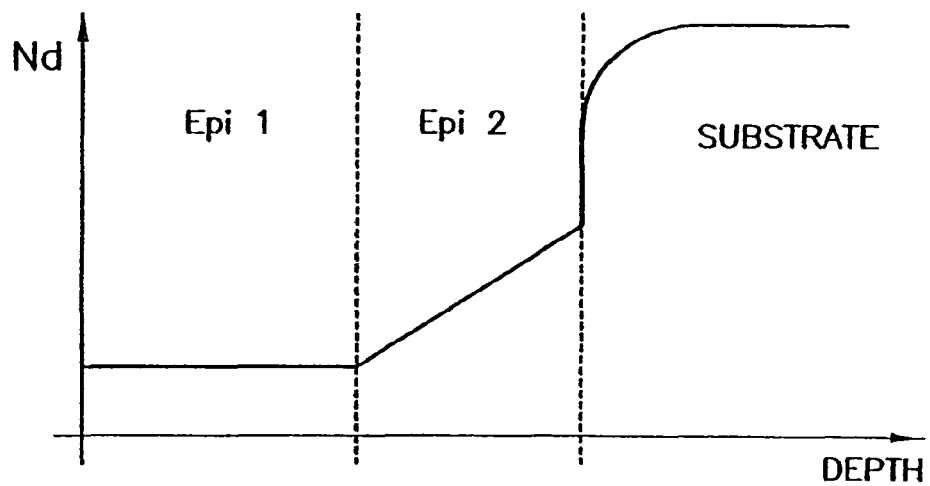
FIG. 1B is a graphical illustration of the doping profile in a linearly graded epitaxial layer.
Figure 1C:
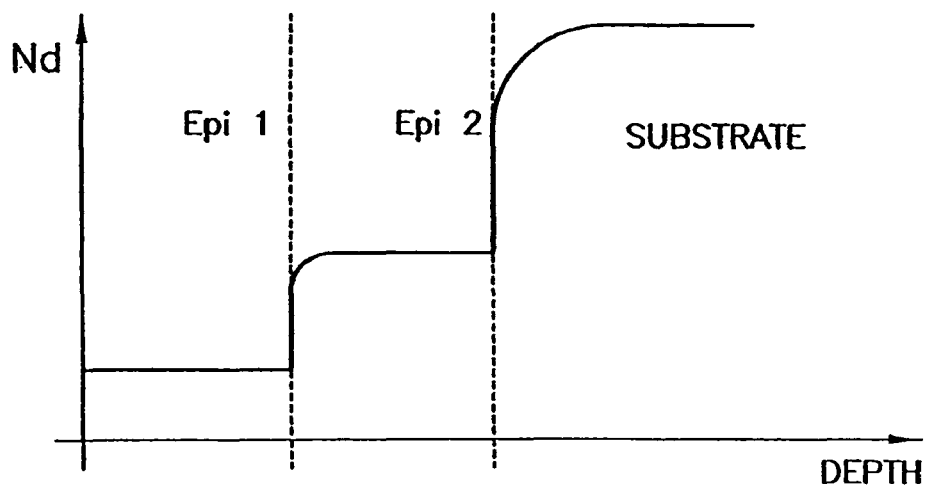
FIG. 1C is a graphical illustration of the doping profile in a double-profiled epitaxial layer.
Figure 7:
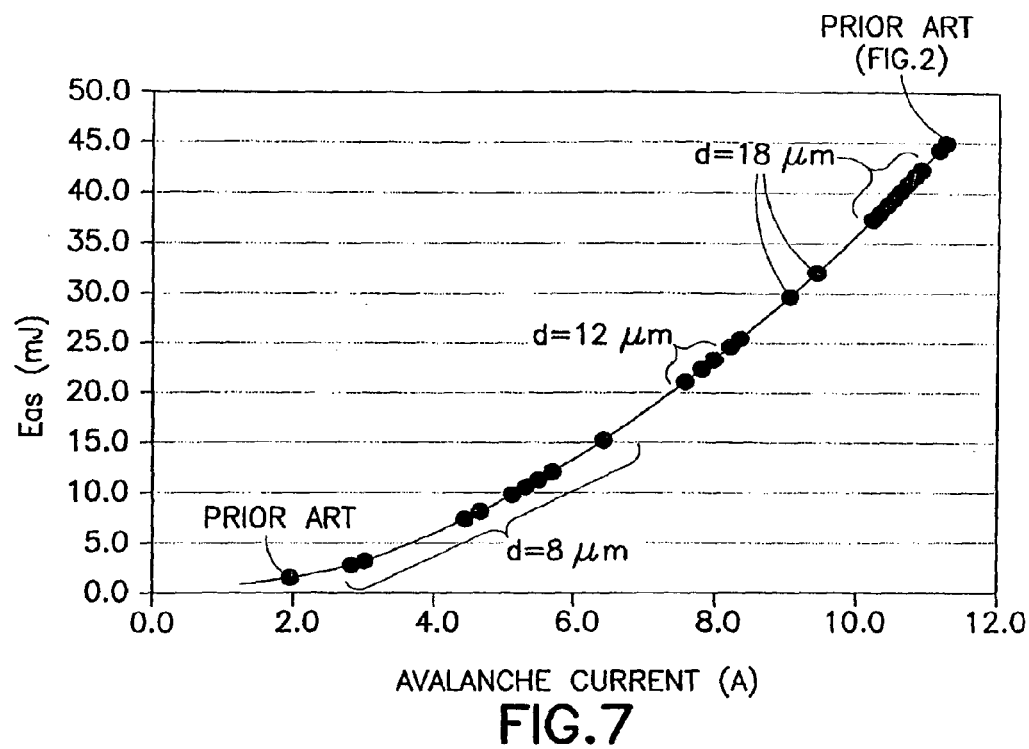
FIG. 7 shows a graphical illustration of the reverse avalanche capability of several embodiments of the present invention.

Referring to FIG. 7, it is shown that as distance "d" between diffusion stripes 28 is increased MPS 26 becomes more capable of absorbing reverse avalanche energy. For example, as distance "d" is increased from about 8 μm to about 18 μm, reverse avalanche energy of MIPS 26 is increased from about 7.5 mJ to about 37.5 mJ. This is a comparable avalanche energy to prior art devices with deep p-well (FIG. 2) which may exhibit an avalanche energy of about 50 mJ (n12A).

Figure 8:
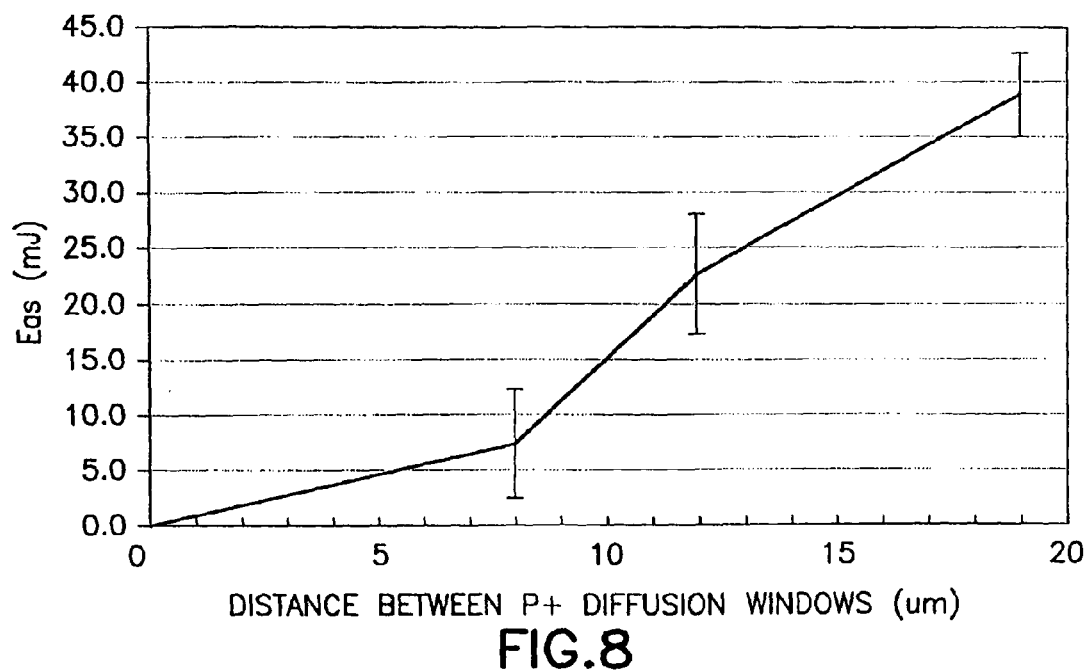
FIG. 8 shows a graphical illustration of the relationship between the spacing of the diffusion regions in an MPS according to the present invention and reverse avalanche energy.

Referring to FIG. 8, it is shown that as distance "d" between diffusion stripes 28 is increased MPS 26 can absorb a larger avalanche current and thus a larger reverse avalanche energy.

Other experiments have shown that a device according to the present invention exhibits a slightly higher leakage current than a comparable prior art device. The increase in the leakage current was found, however, to be within acceptable design limits. Also, a device according to the present invention was found to exhibit a breakdown voltage capability similar to prior art devices, reverse recovery comparable to prior art devices, and a forward voltage drop comparable to prior art devices. However, a device according to the present invention was advantageously manufactured to have diffusion stripes that extend to a lower depth than the diffusion well in a prior art device (FIG. 2) of comparable characteristics.

Thus, a device according to the present invention can be manufactured using lower diffusion temperature and/or lower drive-in time for boron (P+ type diffusion) drive-in at a lower cost, compared to a functionally comparable prior art device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for manufacturing a semiconductor device comprising:
   forming a plurality of stripes of a first conductivity type in a silicon semiconductor body of a second conductivity, each stripe of said plurality of stripes extending a first depth into said silicon semiconductor body;
   spacing each of said plurality of stripes of said first conductivity type from another stripe of said plurality of stripes of said first conductivity type a distance selected so that said semiconductor device exhibits the same reverse avalanche energy absorption characteristics as a Fast Recovery Epitaxial Diode having a diffusion of a depth higher than said first depth; and
   forming a schottky contact layer over said silicon semiconductor body, wherein said schottky contact layer is in contact with said plurality of stripes of said first conductivity and regions of said second conductivity type disposed between said plurality of stripes of said first conductivity.

2. The method of claim 1, wherein said forming said plurality of stripes of said first conductivity comprises:
   epitaxially growing a portion of said semiconductor body;
   depositing an oxide layer on said semiconductor body;
   forming a plurality of windows in said oxide layer;
   implanting dopants into said semiconductor body via said plurality of windows; and
   removing portions of said oxide layer formed over said plurality of stripes of said first conductivity.

3. The method of claim 2, wherein said an edge of said oxide layer lies over an outermost stripe of said plurality of stripes of said first conductivity.

4. The method of claim 1, wherein a first thickness of said semiconductor body at a first stripe of said plurality of stripes is different from a second thickness of said semiconductor body at a second stripe of said plurality of stripes.

5. The method of claim 1, wherein a first doping concentration of said semiconductor body at a first stripe of said plurality of stripes is different from a second doping concentration of said semiconductor body at a second stripe of said plurality of stripes.

6. The method of claim 1, wherein a first distance between a first stripe and a second stripe of said plurality of stripes is greater than a second distance between a third stripe and a fourth stripe of said plurality of stripes.

7. The method of claim 1, wherein a respective position of each of said plurality of stripes improves an ability of said semiconductor device to withstand breakdown under reverse bias conditions.

8. The method of claim 1, wherein a first doping concentration of said semiconductor body at a first stripe of said plurality of stripes is different from a second doping concentration of said semiconductor body at a second stripe of said plurality of stripes.

9. The method of claim 1, wherein a first distance between a first stripe and a second stripe of said plurality of stripes is greater than a second distance between a third stripe and a fourth stripe of said plurality of stripes.

10. A method for manufacturing a semiconductor device comprising:
forming a plurality of P+ doped diffusion stripes in an N− doped silicon substrate, wherein each of said plurality of P+ doped diffusion stripes extends a first depth into said N− doped silicon substrate;
spacing each of said plurality of P+ doped diffusion stripes from another stripe of said plurality of P+ doped diffusion stripes a distance selected such that said semiconductor device exhibits the same reverse avalanche energy absorption characteristics as a Fast Recovery Epitaxial Diode having a diffusion of a depth higher than said first depth; and
forming a schottky contact layer over said N− doped silicon substrate, wherein said schottky contact layer is in contact with said plurality P+ doped diffusion stripes and regions of said N− doped silicon substrate disposed between said plurality of P+ doped diffusion stripes.

11. The method of claim 10, wherein said forming said plurality of P+ doped diffusion stripes comprises:
epitaxially growing said N− doped silicon substrate over an N+ doped silicon substrate;
depositing an oxide layer on said N− doped silicon substrate;
forming a plurality of windows in said oxide layer;
implanting dopants into said N− doped silicon substrate via said plurality of windows; and
removing portions of said oxide layer formed over said plurality of P+ doped diffusion stripes.

12. The method of claim 11, wherein said an edge of said oxide layer lies over an outermost stripe of said plurality of P+ doped diffusion stripes.

13. The method of claim 10, wherein a first thickness of said N− doped silicon substrate at a first stripe of said plurality of P+ doped diffusion stripes is different from a second thickness of said N− doped silicon substrate at a second stripe of said plurality of P+ doped diffusion stripes.

14. The method of claim 10, wherein a doping concentration of said N− doped silicon substrate at a first stripe of said plurality of P+ doped diffusion stripes is different from a doping concentration of said N-doped silicon substrate at a second stripe of said plurality of P+ doped diffusion stripes.

15. The method of claim 10, wherein a first distance between a first stripe and a second stripe of said plurality of P+ doped diffusion stripes is greater than a second distance between a third stripe and a fourth stripe of said plurality of P+ doped diffusion stripes.

16. The method of claim 10, wherein a respective position of each of said plurality of P+ doped diffusion stripes improves an ability of said semiconductor device to withstand breakdown under reverse bias conditions.

17. A method for manufacturing a semiconductor device comprising:
forming a plurality of stripes of a first conductivity type in a semiconductor body of a second conductivity, wherein each stripe of said plurality of stripes extends a first depth into said semiconductor body;
spacing each of said plurality of stripes of said first conductivity type from another stripe of said first conductivity type a distance selected such that said semiconductor device exhibits the same reverse avalanche energy absorption characteristics as a Fast Recovery Epitaxial Diode having a diffusion of a depth higher than said first depth, and
wherein said spacing each of said plurality of stripes improves an ability of said semiconductor device to withstand breakdown under reverse bias conditions; and
forming a schottky contact layer over said semiconductor body, wherein said schottky contact layer is in contact with said plurality of stripes of said first conductivity and regions of said second conductivity type disposed between said stripes of said first conductivity.

18. The method of claim 17, wherein said forming of said plurality of stripes of said first conductivity comprises:
epitaxially growing a portion of said semiconductor body;
depositing an oxide layer on said semiconductor body;
forming a plurality of windows in said oxide layer;
implanting dopants into said semiconductor body via said plurality of windows; and
removing portions of said oxide layer formed over said plurality of stripes of said first conductivity.

19. The method of claim 18, wherein said an edge of said oxide layer lies over an outermost stripe of said plurality of stripes of said first conductivity.

20. The method of claim 17, wherein first a thickness of said semiconductor body at a first stripe of said plurality of stripes is different from a second thickness of said semiconductor body at a second stripe of said plurality of stripes.

* * * * *